United States Patent [19]

Hirose et al.

[11] Patent Number: 4,523,214

[45] Date of Patent: Jun. 11, 1985

[54] SOLID STATE IMAGE PICKUP DEVICE UTILIZING MICROCRYSTALLINE AND AMORPHOUS SILICON

[75] Inventors: Masataka Hirose, Hiroshima; Kazuhiro Kawajiri, Asaka; Yosuke Nakajima, Tokyo, all of Japan

[73] Assignee: Fuji Photo Film Co., Ltd., Minami-ashigara, Japan

[21] Appl. No.: 394,499

[22] Filed: Jul. 2, 1982

[30] Foreign Application Priority Data

Jul. 3, 1981 [JP] Japan .................................. 56-104885
Jul. 3, 1981 [JP] Japan .................................. 56-104886
Jul. 3, 1981 [JP] Japan .................................. 56-104887

[51] Int. Cl.³ ........................................... H01L 27/14
[52] U.S. Cl. ......................................... 357/30; 357/2; 357/63; 357/59; 427/87
[58] Field of Search ................. 357/30 K, 30 F, 30 B, 357/30 H, 30 G, 30, 2, 63, 59; 427/87

[56] References Cited

U.S. PATENT DOCUMENTS 4,226,898 10/1980 Ovshinsky et al. ............... 357/87 X
4,342,044 7/1982 Ovshinsky et al. ............... 357/63 X
4,433,342 2/1984 Patel et al. ............................. 357/2
4,434,318 2/1984 Gibbons ............................. 357/2 X

FOREIGN PATENT DOCUMENTS 62779 5/1980 Japan ........................................ 357/2
2083701 3/1982 United Kingdom ..................... 357/2

OTHER PUBLICATIONS

Carlson, "Photovoltaics V: Amorphous Silicon Cells", *IEEE Spectrum*, Feb., 1980, 39-41.

Primary Examiner—Andrew J. James
Assistant Examiner—William A. Mintel
Attorney, Agent, or Firm—Fleit, Jacobson, Cohn & Price

[57] ABSTRACT

A solid state image pickup device comprising a semiconductor substrate provided with light detecting sections and a scanning circuit for sequentially selecting the signals detected by the light detecting sections, wherein each light detecting section contains a silicon layer in which microcrystalline silicon and amorphous silicon are uniformly distributed and the crystal structure varies substantially continuously throughout. The light detecting section may further contain a hydrogenated amorphous silicon layer containing 6 to 37 atomic % of nitrogen, which is positioned on the silicon layer defined above. The light detecting section is connected with electrodes, one of which is transparent.

8 Claims, 10 Drawing Figures

SOLID STATE IMAGE PICKUP DEVICE UTILIZING MICROCRYSTALLINE AND AMORPHOUS SILICON

BACKGROUND OF THE INVENTION

1. Field of the Invention

This invention relates to a solid state image pickup device, and more particularly to a stacking type solid state image pickup device in which the light detecting sections are formed on a scanning circuit.

2. Description of the Prior Art

Conventional solid state image pickup devices consist of light detecting sections such as photodiodes arranged in matrix form and a scanning circuit for sequentially selecting the signals detected by these light detecting sections. For example, a solid state image pickup device constituted by a combination of a light detecting matrix with a field effect transistor circuit for XY scanning (hereinafter referred to as the XY matrix type) is disclosed in Japanese Patent Publication No. 45(1970)-30768. Further, a solid state image pickup device formed by a combination of a light detecting matrix with a bucket brigade device (BBD), a charge coupled device (CCD) or a charge transfer section of charge priming transfer (CPT) type is described for example in Japanese unexamined Patent Publication Nos. 46(1971)-1221and 47(1972)-26091, and the Japanese magazine "Denshi Zairyo" (Electronic Materials), March 1980, page 6 et seq. However, these known solid state image pickup devices are disadvantageous in that the light use efficiency per unit area of the device is extremely low because the light detecting sections and the circuit for sequentially selecting the signals detected by the light detecting sections (including the aforesaid XY matrix circuit, charge transfer circuit, the field effect transistors serving as switching elements for feeding charges to these circuits, and the like) are positioned two-dimensionally on the same plane.

Recently, it has been proposed to improve the light use efficiency by stacking photoconductive materials on the aforesaid scanning circuit so as to form a multilayer solid state image pickup device. For example, as disclosed in Japanese unexamined Patent Publication No. 49(1974)-91116, photoconductive materials are stacked on an XY matrix type scanning circuit consisting of field effect transistors. In Japanese unexamined Patent Publication No. 55(1980)-27772, it is disclosed to form polycrystalline deposited films by use of heterojunctions of semiconductors comprising the compounds of groups II to VI of the periodic table on a BBD type or CCD type scanning circuit.

On the other hand, an attempt has been made to use amorphous silicon to form semiconductors for solar batteries or electrophotographic photoreceptors. The term "amorphous silicon" as used herein means silicon which, unlike crystalline silicon exhibiting a long-period atomic configuration, exhibits no periodic characteristics of atomic configuration. Conventional amorphous silicon exhibited very unsatisfactory photoelectric characteristics because of structural defects due to lack of periodic configuration. More recently, however, it was found that amorphous silicon containing an element such as hydrogen or fluorine, which reduces the gap state of electrons and positive holes, or reduces the localized states, in the energy gap, exhibits a high photoconductivity at a relatively high resistivity ($10^8$ to $10^9$ $\Omega$.cm). In other words, the amorphous silicon contains elements which reduce the localized states in the energy gap to make the same approximate, more closely, the intrinsic crystalline silicon. More importantly, it was further found that, as in the case of crystalline silicon, the conductivity of such amorphous silicon can be controlled by doping it with an impurity, as described by W. E. Spear and P. G. Comber in "Solid State Communication", Vol. 17 (1975), page 1193 et seq. Thus amorphous silicon has attracted much attention in the basic research and application fields. For example, application thereof to photoelectromotive force devices is described by D. E. Carlson and C. R. Wronski in "Applied Physics Letters", Vol. 28(1976), page 671 et seq.

Under the above circumstances, it has been proposed as disclosed in Japanese unexamined Patent Publication No. 55(1980)-39404 to use amorphous silicon as the photoconductive material for the above-mentioned multi-layer solid state image pickup device. In this type of solid state image pickup device using amorphous silicon, a single amorphous silicon layer is electrically connected to a source electrode or a drain electrode of the field effect transistor of the XY matrix type or charge transfer type scanning circuit combined with MOS type field effect transistors positioned in the matrix form, and a transparent electrode is formed on the amorphous silicon layer.

The inventors eagerly studied the above-described conventional stacking type solid state image pickup device comprising light detecting layers of amorphous materials mainly consisting of silicon superposed on a scanning circuit, and found that conventional hydrogenated amorphous silicon obtained by glow-discharging chemical vapor comprising silicon hydride gas, hydrogen gas and the like exhibits low sensitivities to blue light and red light and cannot give sufficient photoconductive characteristics over the whole visible light region. This presents a very real problem particularly with regard to artificial light such as tungsten light having a high red light intensity. Further, it was found that blue light is absorbed by the transparent electrode positioned on the light inlet side of each light detecting section, and the sensitivity of the light detecting section to blue light further decreases. These problems could be solved by amplifying the light signals of wavelengths to which the light detecting section exhibits low sensitivities. With this method, however, noise is also amplified, resulting in a low signal-to-noise ratio. The above problems could also be solved by lowering the sensitivities to other wavelengths to match the light signal of the wavelength corresponding to the lowest sensitivity of the light detecting section. In this case, however, the sensitivity of the whole image pickup device is limited to the lowest sensitivity of the light detecting section.

SUMMARY OF THE INVENTION

The primary object of the present invention is to provide a stacking type solid state image pickup device provided with light detecting sections exhibiting a sufficient sensitivity to red light.

Another object of the present invention is to provide a stacking type solid state image pickup device provided with light detecting sections exhibiting a sufficient sensitivity to blue light.

The specific object of the present invention is to provide a stacking type solid state image pickup device provided with light detecting sections exhibiting sufficient sensitivities to the whole visible light region.

The stacking type solid state image pickup device in accordance with the present invention is characterized by the light detecting sections each containing a silicon layer in which microcrystalline silicon and amorphous silicon are uniformly distributed, and the crystal structure is continuously changed. The silicon in which microcrystalline silicon and amorphous silicon are uniformly distributed, and the crystal structure is continuously changed is hereinafter referred to as the micro-crystallized composite silicon. Each light detecting section may further contain a hydrogenated amorphous silicon layer containing 6 atomic % to 37 atomic % of nitrogen. In this case, the hydrogenated amorphous silicon layer is positioned on the micro-crystallized composite silicon layer.

The solid state image pickup device in accordance with the present invention exhibits a satisfactory sensitivity to red light because the light detecting sections contain the micro-crystallized composite silicon layer. Further, when the light detecting sections also contain the hydrogenated amorphous silicon layer, the device in accordance with the present invention can exhibit high sensitivities to the whole visible light region. The device also exhibits an extremely high signal-to-noise ratio and can conduct image pickup at a high response speed because of the relatively low resistivity of the micro-crystallized silicon layer.

DESCRIPTION OF PREFERRED EMBODIMENTS

The present invention will hereinbelow be described in further detail with reference to the accompanying drawing.

The inventors conducted the experiments described below and found that the sensitivity of the hydrogenated amorphous silicon to blue light can be improved by incorporating a large amount of nitrogen atoms into the hydrogenated amorphous silicon.

Specimens used in the experiments were prepared as described below.

A quartz or Si substrate was placed in a glow discharge chamber, and a 0.8 kG magnetic field was applied at right angles to the substrate. Then, chemical vapor containing NH$_3$ gas at a ratio between 6 to 95 mol % to SiH$_4$ gas containing 10 mol % of H$_2$ was introduced into the reaction chamber at a predetermined rate, and glow discharge was conducted at a frequency of 13.56 MHz and an electric power of 20 W to form a nitrogen-containing hydrogenated amorphous silicon on the substrate. The temperature of the substrate was between 250° and 300° C., typically 300° C.

Thereafter, the optical and electrical characteristics of the nitrogen-containing hydrogenated amorphous silicon obtained as described above were investigated.

Figure 1:
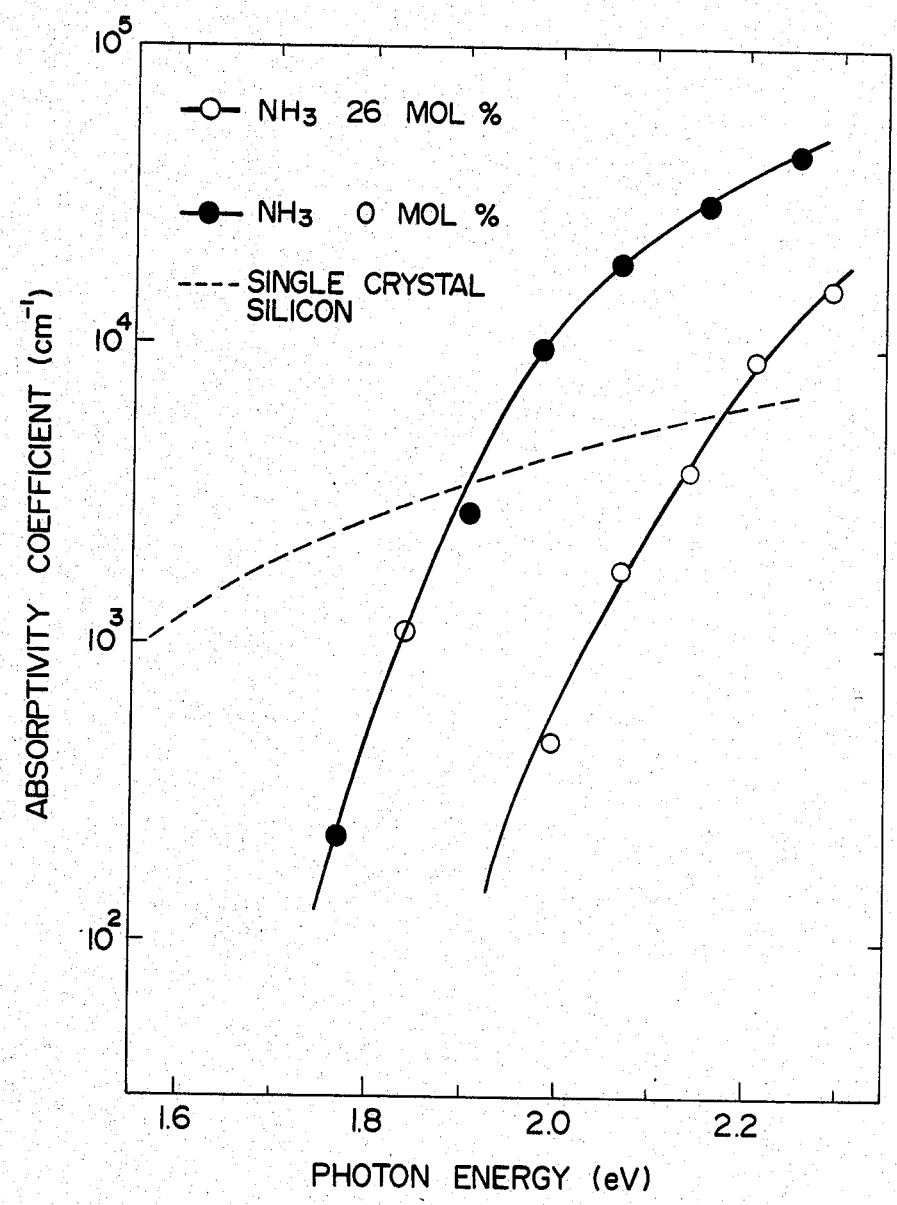
FIG. 1 is a graph showing the dependence of the absorptivity coefficient of the nitrogen-containing amorphous silicon on photon energy.

FIG. 1 shows the dependence of the absorptivity coefficient of the nitrogen-containing hydrogenated amorphous silicon on photon energy. As shown in FIG. 1, the amorphous silicon formed with NH$_3$+SiH$_4$+H$_2$ vapor containing NH$_3$ gas in an amount of 26 mol % with respect to SiH$_4$ gas exhibits the absorptivity coefficient curve shifted to the high energy side compared with the amorphous silicon containing no nitrogen.

Figure 2:
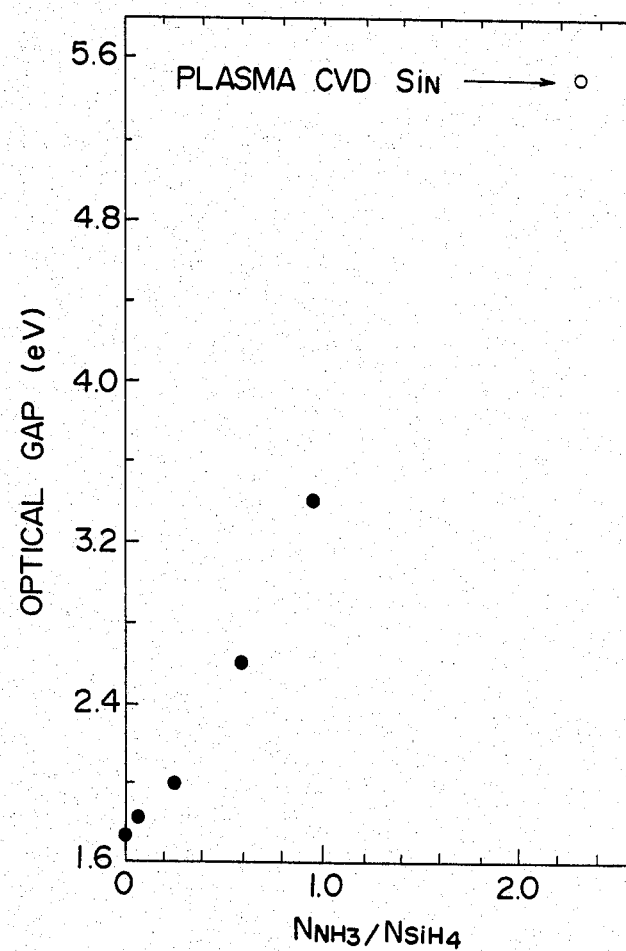
FIG. 2 is a graph showing the dependence of the optical gap of the nitrogen-containing amorphous silicon on the NH$_3$ molar concentration.

FIG. 2 shows the dependence of the optical gap of the nitrogen-containing hydrogenated amorphous silicon on the molar ratio of NH$_3$ gas to SiH$_4$. The optical gap was calculated from the relationship between the absorptivity coefficient and photon energy by the formula:

$$\sqrt{\alpha h\nu} - h\nu$$

wherein $\alpha$ designates the absorptivity coefficient. As shown in FIG. 2, the optical gap increases as the nitrogen content in the chemical vapor increases. For example, when the molar concentration of NH$_3$ is 26%, the optical gap is 2.0 eV. Therefore, it is possible to increase the sensitivity of the silicon to blue light having a short wavelength.

Figure 3:
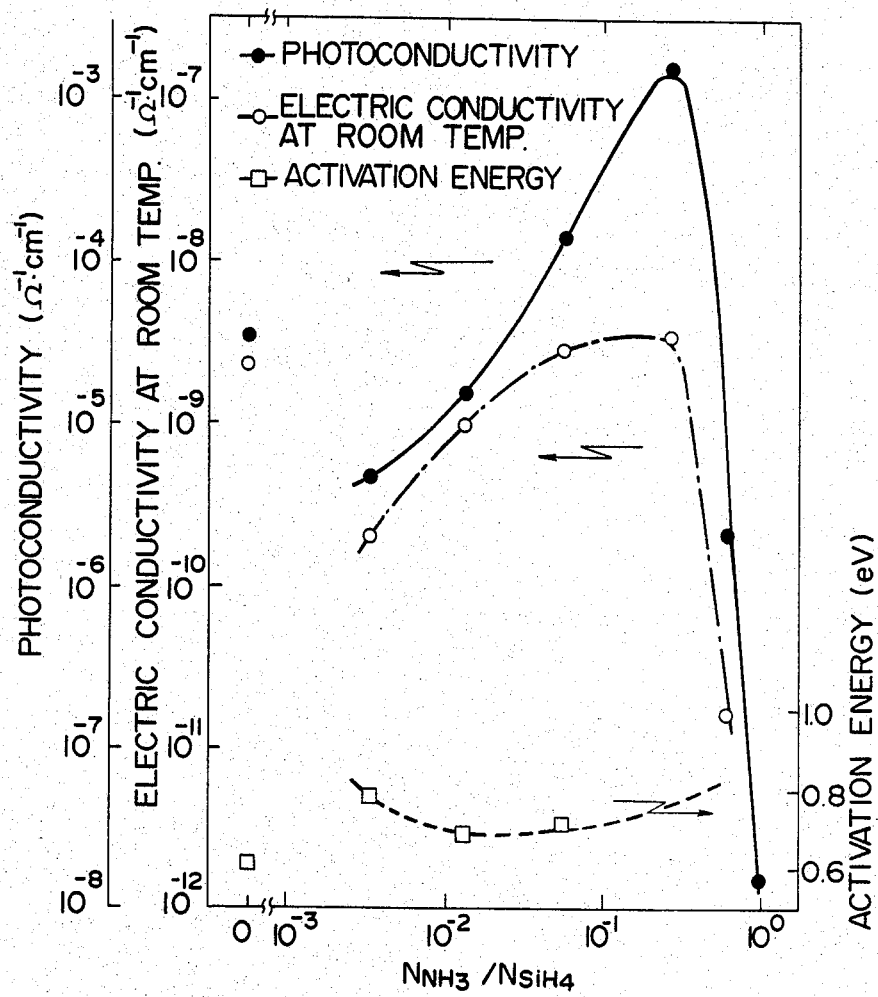
FIG. 3 is a graph showing the dependence of the electric conductivity at room temperature, photoconductivity and activation energy of the nitrogen-containing amorphous silicon on the NH$_3$ molar concentration.

FIG. 3 shows the dependence of the electric conductivity at room temperature, photoconductivity (when exposed to AM1 light) and activation energy of the nitrogen-containing hydrogenated amorphous silicon on the NH$_3$ molar concentration. As shown in FIG. 3, the photoconductivity and the electric conductivity at room temperature increase as the nitrogen content in the chemical vapor increases. They reach their maximum when the NH$_3$ concentration is 26 mol %, and thereafter decrease.

Particularly, the photoconductivity is $1.6 \times 10^{-3}$ $(\Omega.cm)^{-1}$ when the NH$_3$ molar concentration is 26%, and thus improved by a factor of several tens or more compared with a non-doped amorphous silicon.

As shown in FIG. 3, the activation energy of the nitrogen-containing hydrogenated amorphous silicon does not change greatly when the NH$_3$ molar concentration increases up to 26%.

Figure 4:
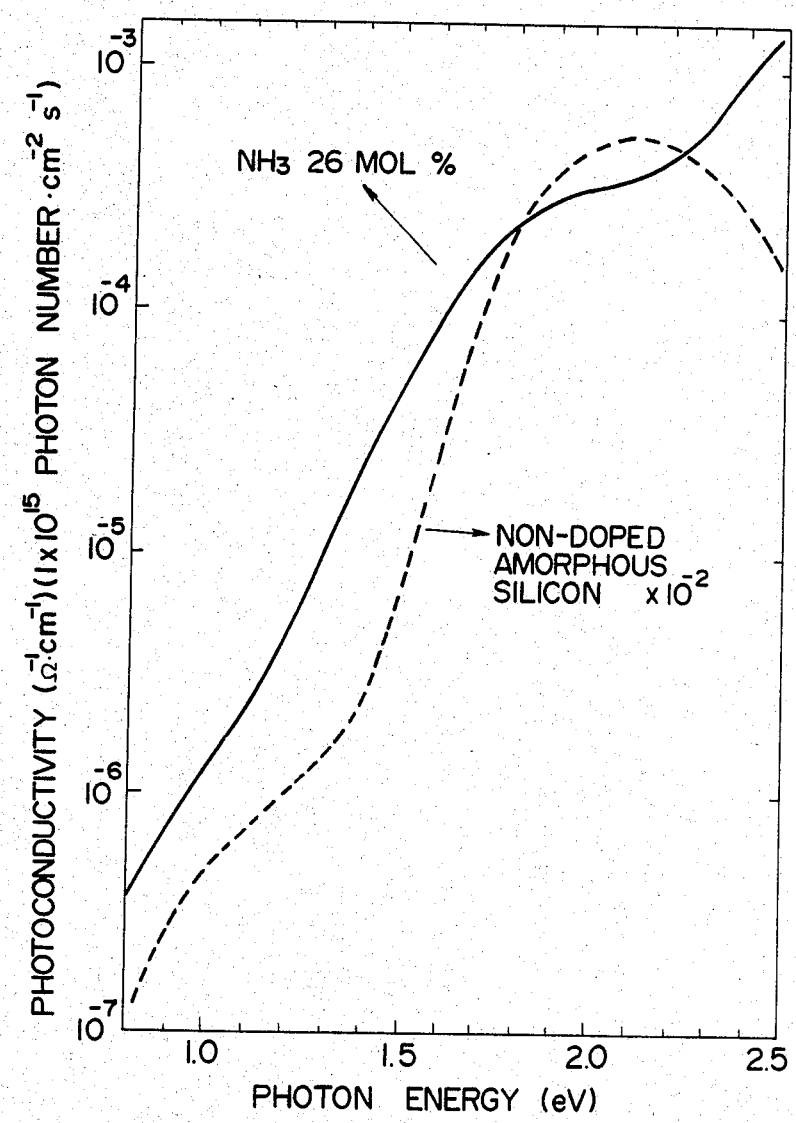
FIG. 4 is a graph showing the dependence of the photoconductivity of the nitrogen-containing amorphous silicon on the photon energy.

FIG. 4 shows the dependence of the photoconductivity of the nitrogen-containing hydrogenated amorphous silicon on photon energy. As shown in FIG. 4, at a photon energy level of up to 2.2 eV, the amorphous silicon obtained with chemical vapor containing 26 mol % of NH$_3$ gas exhibits a photoconductivity improved by a factor of several tens over that of a non-doped amorphous silicon. At a photon energy level above 2.2 eV where the sensitivity of the non-doped amorphous silicon drops, the nitrogen-containing hydrogenated amorphous silicon exhibits a further improvement in photoconductivity.

The results of the experiments conducted by the inventors are shown in Table 1. Table 1 also indicates the contents of nitrogen atoms in the nitrogen-containing hydrogenated amorphous silicon, which were determined by Auger analyses. For reference, Table 1 also shows the results of experiments on SiN by plasma-enhanced chemical vapor deposition (plasma-enhanced CVD), in which the $NH_3$ concentration was 230 mol %.

TABLE 1

| | | | | | |
|---|---|---|---|---|---|
| $N_{NH_3}/N_{SiH_4}$ (molar ratio) | 0.06 | 0.26 | 0.60 | 0.95 | 2.3 |
| Optical gap (ev) | 1.85 | 2.0 | 2.6 | 3.4 | 5.4 |
| Photoconductivity $(\Omega \cdot cm)^{-1}$ | $1.5 \times 10^{-4}$ | $1.6 \times 10^{-3}$ | $1.8 \times 10^{-6}$ | $1.6 \times 10^{-8}$ | — |
| Electric conductivity at room Temp. $(\Omega \cdot cm)^{-1}$ | $2.6 \times 10^{-9}$ | $4 \times 10^{-9}$ | $2 \times 10^{-11}$ | very low | Insulator |
| N/Si + N (atomic %) | ~6 | ~22 | ~37 | ~51 | ~54 |

The results of the experiments described above revealed that the nitrogen-containing hydrogenated amorphous silicon deposited by use of chemical vapor containing $NH_3$ gas in an amount between 6 and 60 mol % with respect to $SiH_4$ gas, namely the hydrogenated amorphous silicon having a composition containing nitrogen in an amount between 6 and 37 atomic %, exhibits a sufficient photoconductivity and an optical gap suitable for the visible light region and, therefore, suitable for forming the light detecting sections.

The inventors further conducted the experiments described below and found that a silicon material in which microcrystalline silicon and amorphous silicon are uniformly distributed and the crystal structure is continuously changed exhibits a sensitivity to red light improved over that of the amorphous silicon.

Specimens used in the experiments were prepared as described below.

A quartz substrate was placed in a glow discharge chamber, and a magnetic field having an intensity between 0 and 0.8 kG was applied at right angles to the substrate. Then, $SiH_4$ gas containing $H_2$ gas in an amount between 1 and 10 mol % was introduced into the reaction chamber at a rate of 27 SCCM, and glow discharge was conducted at a frequency of 13.56 MHz and an electric power between 5 W and 50 W to form a micro-crystallized silicon as defined above. The pressure in the reaction chamber during the preparation of specimens was about 0.2 Torr. The temperature of the substrate was between 250° and 300° C., typically 300° C.

Thereafter, the optical and electric characteristics of the micro-crystallized composite silicon obtained as described above were investigated.

Figure 5:
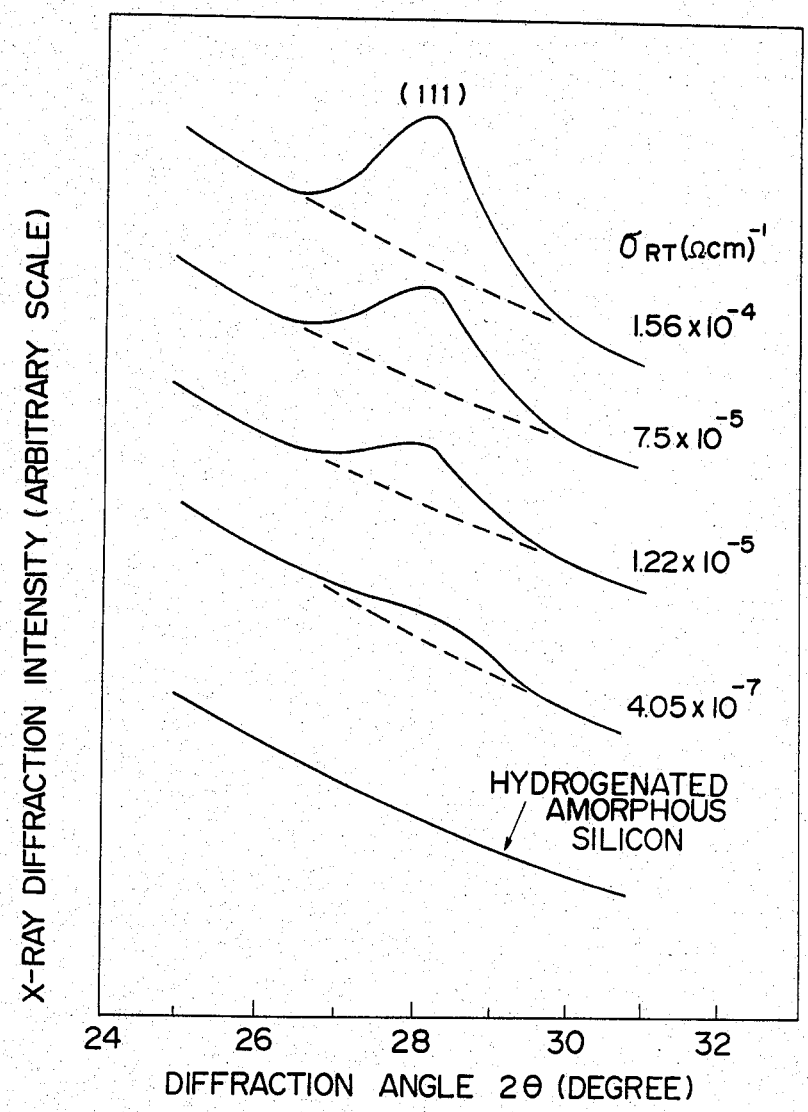
FIG. 5 is a graph showing the results of X-ray diffractometric analyses of the micro-crystallized composite silicon.

FIG. 5 shows the results of X-ray diffractometric analyses of the micro-crystallized silicon. From FIG. 5, it will be noted that, unlike the amorphous silicon, the microcrystallized composite silicon exhibits a diffraction peak corresponding to the (111) lattice plane which develops in the vicinity of $2\theta = 28°$, and that the peak height increases as the degree of micro-crystallization increases. It was also found that the half-value width of the diffraction peak remains constant at about 1.5° even when the peak height changes. This indicates that the crystal size remains constant, while the number of crystal grains increases. The micro-crystallized composite silicon includes microcrystalline silicon and amorhous silicon which are uniformly distributed therein and the crystal structure of the silicon composition varies substantially continuously throughout, hence, the terminology that the "microcrystalline silicon and amorphous are uniformly distributed and the crystal structure is continuously changed." Since the results of the X-ray diffractometric analyses of the micro-crystallized composite silicon reveal that the crystal size remains constant while the number of crystal grains increases, it can be said microcrystalline silicon has a long-period atomic configuration and that the microcrystalline silicon is fixed in the amorhous silicon and the entire composition could loosely be called an "aggregate". From the room-temperature electric conductivity $\sigma_{RT}$ of each micro-crystallized composite silicon shown in FIG. 5, it was found that micro-crystallization occurred in the specimens exhibiting a room-temperature electric conductivity $\sigma_{RT}$ of $\sim 10^{-7}$ $(\Omega.cm)^{-1}$ or more.

Figure 6:
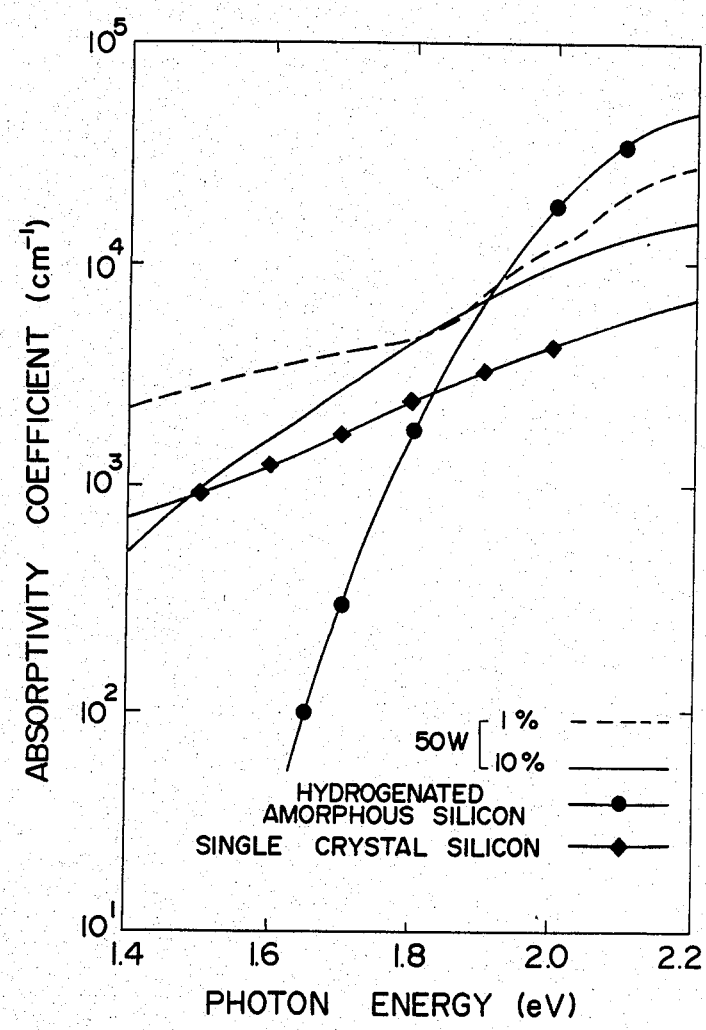
FIGS. 6 and 7 are graphs showing the dependence of the absorptivity coefficient of the micro-crystallized composite silicon on photon energy.
Figure 7:
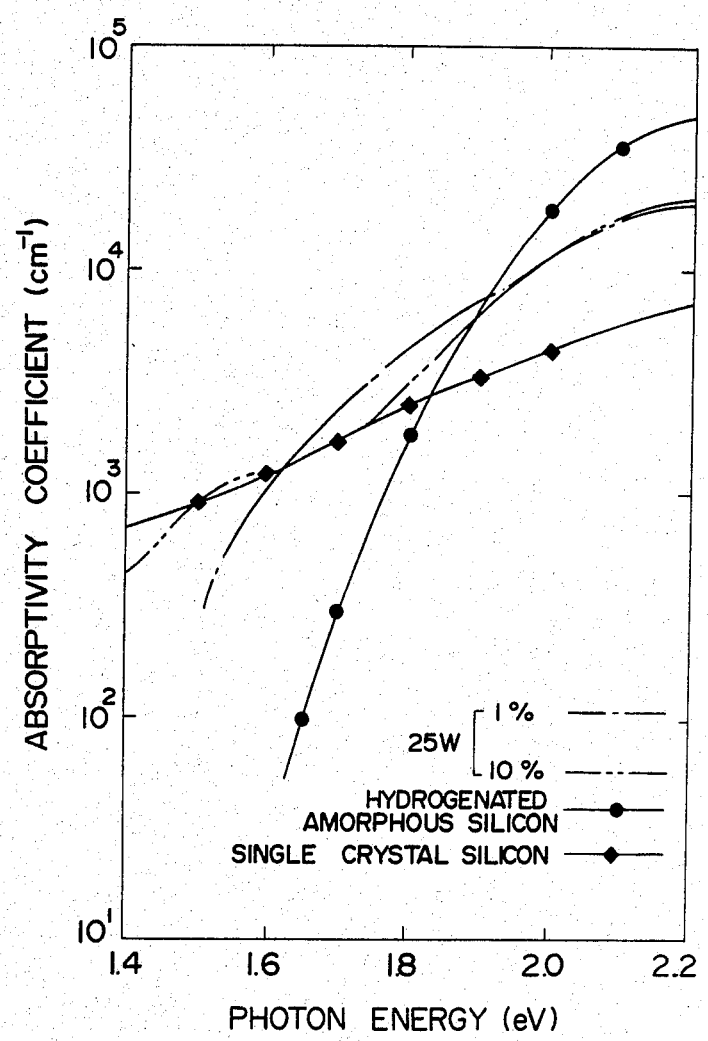

FIGS. 6 and 7 shows the dependence of the absorptivity coefficients of the micro-crystallized composite silicon deposited at a radio frequency power of 50 W and 25 W respectively on photon energy. From FIGS. 6 and 7, it will be understood that the hydrogenated amorphous silicon exhibits a very low absorption of red light compared with the single crystal silicon. This is attributable to the fact that the optical gap of the amorphous silicon (about 1.7 eV) is wider than that of the single crystal silicon (about 1.1 eV). FIGS. 6 and 7 show the absorptivity coefficients of four micro-crystallized composite silicon specimens prepared under the following different conditions of the radio frequency power and $H_2$ mol percentage: 50 W, 1%; 50 W, 10%; 25 W, 1%; 25 W, 10%. As shown in FIGS. 6 and 7, in all of these specimens, the absorptivity coefficient approaches that of the single crystal on the long wavelength side. On the short-wavelength side above 2.0 eV, these specimens exhibits an absorptivity coefficient near that of the amorphous silicon and higher than that of the single crystal silicon. The results also show that the higher the radio frequency power is, the higher is the degree of micro-crystallization in the micro-crystallized composite silicon.

Figure 8:
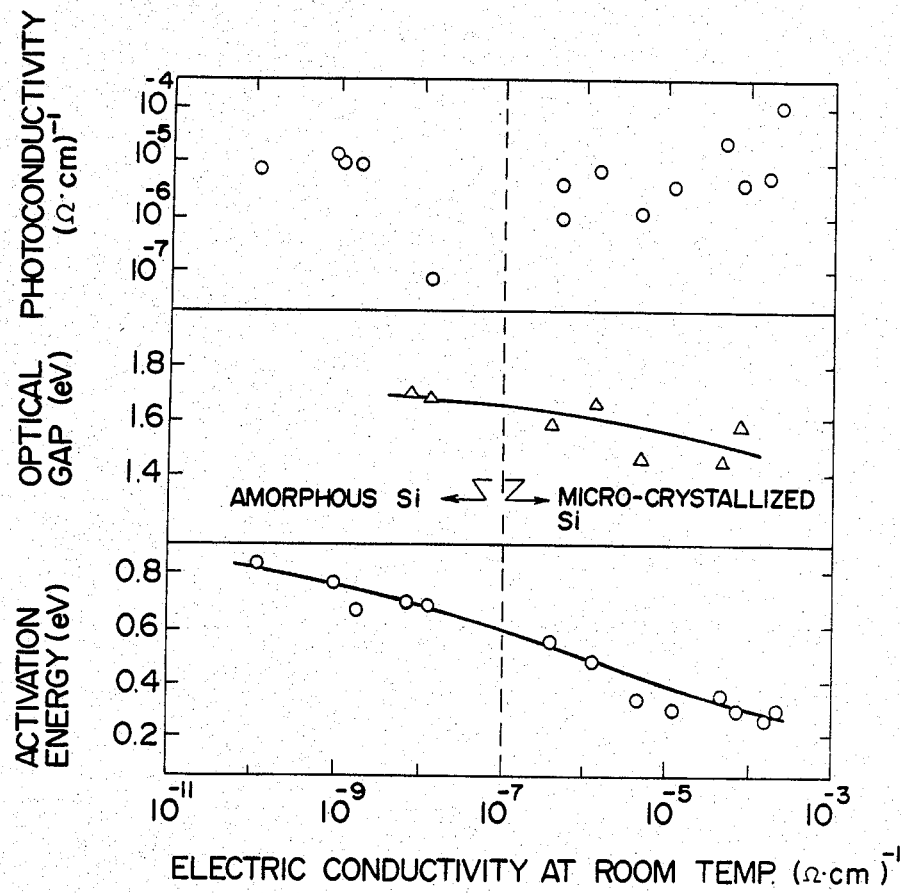
FIG. 8 is a graph showing the dependence of the photoconductivity, optical gap and activation energy of the micro-crystallized composite silicon on the electric conductivity at room temperature.

FIG. 8 shows the dependence of the photoconductivity (when exposed to light of photon number of $\sim 10^{15} cm^{-2} \cdot S^{-1}$ and photon energy of 2 eV), optical gap and activation energy of the micro-crystallized silicon on the electric conductivity at room temperature. As shown in FIG. 8, there is a tendency for the photoconductivity to increase as the degree of micro-crystallization increases. The optical gap decreases as the degree of micro-crystallization increases, and is about 1.5 eV when the room-temperature electric conductivity is about $10^{-4}(.cm)^{-1}$. Further, the absorptivity coefficient is $10^3 cm^{-1}$ at photon energy of 1.5 eV. Therefore, it is understood that the micro-crystallized composite silicon is more sensitive to red light than the amorphous silicon. The activation energy decreases as the degree of micro-crystallization increases in the micro-crystallized composite silicon.

When the above-described hydrogenated amorphous silicon containing nitrogen atoms and exhibiting a high sensitivity to blue light is used as an upper layer of each light detecting section, and the micro-crystallized composite silicon is used as a lower layer of the light detecting section, it is possible to obtain the stacking type solid state image pickup device. Such a light detecting section exhibits sufficient sensitivities to the whole visible light region.

Figure 9:
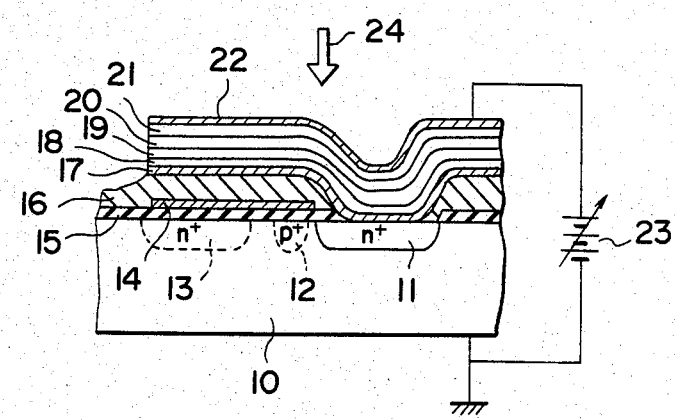
FIG. 9 is a sectional view showing the sectional construction of a unit in the stacking type solid state image pickup device in accordance with the present invention.

FIG. 9 shows a preferred embodiment of the solid state image pickup device in accordance with the present invention.

A diode is formed by an n+ type region 11 in a p type semiconductor substrate 10. A p+ type region 12 serves as a potential barrier to prevent electrons from being injected from an n+ type region 13 in the case of CCD operation. The n+ type region 13 serves as a potential well in the case of BBD operation. Alternatively, only the region 12 or the region 13 need be provided if the device is limited to CCD or BBD operation, respectively. Hereinbelow is described BBD operation with the n+ type region 13. A first gate electrode 14 has a portion overlapping the n+ type region 11. An insulator film or a gate oxide film 15 is formed between the semiconductor substrate 10 and the first gate electrode 14. An insulator layer 16 is formed to electrically isolate a first electrode 17 from the semiconductor substrate 10 and the first gate electrode 14. The first electrode 17 is a diode electrically connected to the n+ type region 11. An n type micro-crystallized composite silicon layer 18 serves as a positive hole-blocking layer. Reference numeral 19 designates an i type micro-crystallized composite silicon layer, and reference numeral 20 designates an i type nitrogen-containing amorphous silicon layer. A p type nitrogen-containing amorphous silicon layer 21 serves as an electron blocking layer. In this way, a p-i-n type photodiode is formed as a light detecting section. On the light detecting section is provided a transparent electrode 22, to which a positive voltage is applied from a power source 23. The level of this positive voltage is selected suitably to restrict blooming in a manner already known.

In the embodiment described above, the light detecting section is constructed in the form of a diode for the purpose of minimizing the dark current occurring due to the relatively low resistance of the micro-crystallized composite silicon.

It is well known that pn type control of the amorphous silicon and the micro-crystallized composite silicon can be conducted by adding for example $PH_3$ (in the case of the n type) or $B_2H_6$ (in the case of the p type) to chemical vapor consisting of silane gas such as $SiH_4$, $H_2$ gas and the like.

Preferably, the n type micro-crystallized composite silicon layer 18 has a thickness between $0.05\mu$ and $0.2\mu$, the i type micro-crystallized composite silicon layer 19 has a thickness between 300 Å and $3\mu$, particularly between 5000 Å and $3\mu$, the i type nitrogen-containing amorphous silicon layer 20 has a thickness between 50 Å and $1\mu$, particularly between 300 Å and 5000 Å, and the p type nitrogen-containing amorphous silicon layer 12 has a thickness between $0.05\mu$ and $0.2\mu$. The ratio of the thickness of the i type micro-crystallized composite silicon layer 19 to that of the i type nitrogen-containing silicon layer 20 can be determined appropriately according to the degree of micro-crystallization of the micro-crystallized composite silicon, nitrogen content of the amorphous silicon layer or the spectral characteristics of the incident light.

The micro-crystallized composite silicon layer 19 and the nitrogen-containing silicon layer 20 need not have a clear boundary therebetween, and their configuration may be changed gradually.

Further, an amorphous silicon layer containing no nitrogen may be positioned between the micro-crystallized composite silicon layer 19 and the nitrogen-containing silicon layer 20.

In another embodiment of the solid state image pickup device in accordance with the present invention, a p-n type diode is formed as the light detecting section. In this embodiment, the i type layers in the embodiment shown in FIG. 9 are replaced by p type or n type layers, and the n type or p type layer in the embodiment shown in FIG. 9 is removed.

When incident light 24 is applied to the light detecting section of the solid state image pickup device in accordance with the present invention, blue light is absorbed by the i type nitrogen-containing amorphous silicon layer 20, and red light is absorbed by the i type micro-crystallized composite silicon layer 19. As a results, electron-positive hole pairs are formed, and the electrons and the positive holes reach the electrodes 17 and 22 respectively to lower the potential of the electrode 17. The potential drop is proportional to the amount of the incident light and is stored during one field period. Thereafter, when a read out signal voltage is applied to the first gate electrode 14, the surface potential of the semiconductor below the first gate electrode 14 rises. As a result, electrons are transferred from the n+ type region 11 to the n+ type region 13, and the potential of the n+ type region 11 returns to the original value. Therefore, the total amount of the charges shifting to the n+ type region 13 is proportional to the illuminance of the incident light.

The light detecting section and the first gate electrode 14 in one unit of the solid state image pickup device operate as described above. The charges of the photoelectrically electrically converted signal which has been read into the n+ type region 13 can be transferred and output according to a known precedure.

Figure 10:
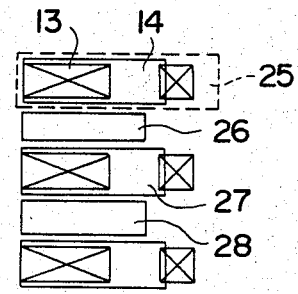
FIG. 10 is a plan view showing the unit shown in FIG. 9 arranged in one linear direction.

For example, the charge transfer can be conducted by the self scanning described below. FIG. 10 is a plan view showing one unit of the solid state device shown in FIG. 9, which is arranged in one direction. In FIG. 10, a section 25 surrounded by the broken line indicates the one unit. A second gate electrode 26 is positioned between the first gates 14 and 27 contained in the adjoining units. When a transfer pulse is applied according to a known procedure, the charges read out by the first gate electrode 14 are transferred to the position below the second gate electrode 26. The charges are then transferred to the first gate electrode 27, a second gate electrode 28 and so on up to the output stage according to a known principle. Namely, the signal photoelectrically converted by the light detecting section can be sent to the output stage by use of two-phase clock signals.

In the above-described embodiment of the device in accordance with the present invention, the scanning circuit is of the CCD or BBD charge transfer type. In this connection, however, it should be understood that the scanning circuit may of course be of the XY matrix type as disclosed for example in Japanese unexamined Patent Publication No. 49 (1974)-91116. Further, the above-described field effect type transistor circuit may be replaced for example by a thin film type field effect transistor circuit provided on a glass substrate, as described in "Proceedings of the IEEE", The Institute of Electrical and Electronics Engineers, Inc., Vol. 52, No. 12, December 1964, pages 1479 to 1486. The scanning circuit may also be constructed by using a known semiconductor switching circuit.

In the embodiments described above, the device is referred to as having the p type semiconductor substrate. However, it is also possible to use an n type semiconductor substrate and change the conduction types of the layers in the light detecting section and the scanning circuit.

We claim:

1. A solid state image pickup essentially consisting of a semiconductor substrate provided with light detecting sections and a scanning means for sequentially selecting the signals detected by said light detecting sections, each light detecting section contains a first silicon layer in which microcrystalline silicon and amorphous silicon are uniformly distributed and the crystal structure of said first silicon layer varies substantially continuously throughout.

2. A device as defined in claim 1 wherein each light detecting section further contains a hydrogenated amorphous silicon layer containing nitrogen in an amount between 6 and 37 atomic % stacked adjacent said first silicon layer.

3. A device as defined in claim 2 wherein said hydrogenated amorphous silicon layer containing nitrogen in an amount between 6 and 37 atomic % is provided as an upper layer, and said first silicon layers in which microcrystalline silicon and amorphous silicon are uniformly distributed and the crystal structure of said first silicon layer varies continuously throughout is provided as a lower layer.

4. A device as defined in claim 1 wherein said light detecting sections are photodiodes.

5. A device as defined in claim 4 wherein said photodiodes are of the p-i-n type.

6. A device as defined in claim 4 wherein said photodiodes are of the p-n type.

7. A device as defined in claim 1 further comprising electrodes coupled to said light detecting sections.

8. A device as defined in claim 7 wherein one of said electrodes is transparent.

* * * * *